(12) United States Patent
Nishi et al.

(10) Patent No.: US 9,166,086 B2
(45) Date of Patent: Oct. 20, 2015

(54) METHOD FOR MANUFACTURING SOLAR CELL MODULE PROVIDED WITH AN EDGE SPACE

(71) Applicant: SHOWA SHELL SEKIYU K.K., Tokyo (JP)

(72) Inventors: Hirofumi Nishi, Tokyo (JP); Hirohisa Suzuki, Tokyo (JP)

(73) Assignee: SOLAR FRONTIER K.K., Tokyo (JP)

( * ) Notice: Subject to any disclaimer, the term of this patent is extended or adjusted under 35 U.S.C. 154(b) by 0 days.

(21) Appl. No.: 14/051,487

(22) Filed: Oct. 11, 2013

(65) Prior Publication Data

US 2014/0038343 A1 Feb. 6, 2014

Related U.S. Application Data

(62) Division of application No. 13/259,539, filed as application No. PCT/JP2010/056833 on Apr. 16, 2010, now Pat. No. 8,603,853.

(30) Foreign Application Priority Data

Apr. 17, 2009 (JP) ................................. 2009-100472

(51) Int. Cl.
| | |
|---|---|
| *H01L 31/054* | (2014.01) |
| *H01L 31/042* | (2014.01) |
| *H01L 31/0224* | (2006.01) |
| *H01L 31/0392* | (2006.01) |

(Continued)

(52) U.S. Cl.
CPC ...... *H01L 31/042* (2013.01); *H01L 31/022425* (2013.01); *H01L 31/03923* (2013.01); *H01L 31/046* (2013.01); *H01L 31/0749* (2013.01); *H01L 31/18* (2013.01); *Y02E 10/541* (2013.01); *Y02E 10/543* (2013.01)

(58) Field of Classification Search
USPC ........................................................ 438/80, 73
See application file for complete search history.

(56) References Cited

U.S. PATENT DOCUMENTS

| | | | |
|---|---|---|---|
| 6,300,556 B1 | 10/2001 | Yamagishi et al. | |
| 6,372,636 B1 * | 4/2002 | Chooi et al. | 438/639 |

(Continued)

FOREIGN PATENT DOCUMENTS

| | | |
|---|---|---|
| JP | 04-094174 A | 3/1992 |
| JP | 2002-111023 A | 4/2002 |

(Continued)

OTHER PUBLICATIONS

International Search Report (PCT/ISA/210) issued on Aug. 3, 2010 in the International Patent Application No. PCT/JP2010/056833.

*Primary Examiner* — Allen Parker
(74) *Attorney, Agent, or Firm* — Sughrue Mion, PLLC

(57) ABSTRACT

The solar cell module having a preferable edge space that prevents characteristics of a solar cell such as conversion efficiency from being deteriorated without making processes complicated is provided. In a method for manufacturing a solar cell module including a substrate glass, a first layer formed on the substrate glass and a second layer formed on the first layer, the method includes a step of forming a first edge space having a first width by removing the first layer and the second layer by the first width from an end part of the glass substrate and a step of forming a second edge space by removing only the second layer by a second width from the end part of the glass substrate, and the width of the second edge space is larger than the width of the first edge space.

8 Claims, 10 Drawing Sheets

(51) Int. Cl.
*H01L 31/0749* (2012.01)
*H01L 31/18* (2006.01)
*H01L 31/046* (2014.01)

(56) References Cited

U.S. PATENT DOCUMENTS

| | | | |
|---|---|---|---|
| 6,380,478 B1 * | 4/2002 | Yamamoto et al. | 136/244 |
| 2002/0074318 A1 | 6/2002 | Vogt et al. | |
| 2008/0178925 A1 * | 7/2008 | Wu et al. | 136/244 |
| 2009/0032094 A1 | 2/2009 | Aoki | |
| 2009/0090618 A1 * | 4/2009 | Hashimoto et al. | 204/192.25 |
| 2009/0194150 A1 * | 8/2009 | Aoki | 136/252 |
| 2009/0217969 A1 | 9/2009 | Matsushima et al. | |
| 2009/0223562 A1 * | 9/2009 | Niira et al. | 136/256 |
| 2011/0088750 A1 | 4/2011 | Stolt et al. | |
| 2011/0114161 A1 | 5/2011 | Uchida et al. | |

FOREIGN PATENT DOCUMENTS

| | | |
|---|---|---|
| JP | 2002-322765 A | 11/2002 |
| JP | 2002-540950 A | 12/2002 |
| JP | 2004-186547 A | 7/2004 |
| JP | 2006-086390 A | 3/2006 |
| JP | 2006-216608 A | 8/2006 |
| JP | 2007-123721 A | 5/2007 |
| JP | 2008-282944 A | 11/2008 |
| WO | 2007-086522 A1 | 8/2007 |
| WO | 2008-139974 A1 | 11/2008 |

* cited by examiner

METHOD FOR MANUFACTURING SOLAR CELL MODULE PROVIDED WITH AN EDGE SPACE

CROSS REFERENCE TO RELATED APPLICATIONS

This is a divisional of application Ser. No. 13/259,539 filed Sep. 23, 2011, which is the National Stage of PCT/JP2010/056833 filed Apr. 16, 2010 (which claims benefit of Japanese Patent Application No. 2009-100472 filed Apr. 17, 2009), the disclosures of which are hereby incorporated by reference.

TECHNICAL FIELD

The present invention relates to a technique of a solar cell module having an edge space, and more particularly relates to a CIS-based (a general name of a $CuInSe_2$-based including CIS, CIGS, CIGSS or the like) thin film solar cell module.

BACKGROUND ART

Usually, in the CIS-based thin film solar cell module, layers including a metallic base electrode layer, a p type light absorbing layer, a high resistance buffer layer and an n type window layer (a transparent conductive film) are respectively laminated on the surface of a substrate (109) to form the CIS-based thin film solar cell module. A filler (103) having a sealing effect such as an EVA (Ethylene-Vinyl Acetate) resin, PVB (Polyvinyl Butyral), etc. is put thereon and cover glass (102) of an upper surface is laminated and attached thereon. The obtained solar cell module is surrounded by a frame (101) made of aluminum etc. to cover an end part of the solar cell module. Between the frame and the solar cell module, a resin is sandwiched (not shown in the drawing) to prevent moisture such as water from entering from the end part of the cover glass (102) and improve a weather resistance (see FIG. 1).

On the other hand, there is a frameless solar cell module to which an aluminum frame is not attached in order to lighten the solar cell module and reduce a production cost. As such a frameless solar cell module, a solar cell module that includes a light receiving surface side film, a light receiving surface side filler, a plurality of solar cell elements electrically connected together by connecting tabs, a back surface side filler and a back surface side film which are sequentially arranged so as to be piled, and has a structure in which a peripheral edge part of the light receiving surface side film is fusion welded to a peripheral edge part of the back surface side film is proposed (see patent document 1).

Further, as another frameless solar cell module, a structure in which when a frameless solar cell module is laid on a member to be attached such as a roof of a residence having a gradient, rod shaped joint fillers are held between the solar cell modules adjacent in the direction of the gradient of the member to be attached to lay the solar cell modules so that all the rod shaped joint fillers do not protrude from the surfaces of the solar cell modules is proposed (see patent document 2).

Further, a frameless solar cell module that has an edge space (a space where device layers are not piled) provided in a periphery of a solar cell circuit is also proposed (see FIG. 2 and patent document 3). When the edge space is provided, the frame does not need to be attached and a production cost can be more reduced and the solar cell module can be more lightened than the solar cell module of a type having the frame. As a manufacturing method of the solar cell module of this type, after a laminated film (a first electrode (108)/a semiconductor layer (107)/a second electrode (104)) is formed on the entire surface of a light receiving surface side of a substrate (109), the laminated film of an area corresponding to the edge space is removed by a laser or a sandblaster etc. to form the edge space (see FIG. 2). For instance, patent document 4 discloses a technique for removing a laminated film of an edge space area by using a YAG laser.

BACKGROUND ART DOCUMENT

Patent Documents

Patent Document 1: JP-A-2006-86390
Patent Document 2: JP-A-2002-322765
Patent Document 3: JP-A-2008-282944
Patent Document 4: JP-T-2002-540950

SUMMARY OF THE INVENTION

Problems that the Invention is to Solve

When the laminated film of the edge space part is removed, a problem arises that a performance (especially, conversion efficiency) of a solar cell circuit is deteriorated. Here, the solar cell circuit means the laminated film formed on the substrate before the edge space is formed and the cover glass is laminated. Now, a principle will be described below that the above-described problem arises in the case of a CIS-based thin film solar cell.

FIG. 3A is a plan view seen from a light receiving surface side of the CIS-based thin film solar cell. FIG. 3B is an enlarged sectional view of the CIS-based thin film solar cell in the direction perpendicular (a-a' in FIG. 3A) to a division groove. As shown in FIG. 3B, the circuit is formed with a plurality of cells which are formed by dividing the semiconductor layer and the second electrode by a plurality of mutually parallel division grooves.

Here, when the edge space (a part surrounded by a dotted line in FIG. 3A) of an end part perpendicular to the division grooves is formed by the sandblaster, the laminated film may be damaged in an end part of the laminated film exposed to the edge space to deteriorate the conversion efficiency of the circuit. (Namely, after the edge space is formed, a boundary part to the edge space in the laminated film may be possibly damaged to deteriorate the conversion efficiency of the circuit.) Further, in a process by the sandblaster, as a further problem, a problem arises that cleaning up of sand is complicated after the laminated film is removed to increase the production cost.

On the other hand, when the laser is used in place of the sandblaster, the problem does not arise for the process of the sand. However, in order to remove the first electrode (an Mo layer), a strong laser equivalent to 430 W is necessary. Since the first electrode (the Mo layer) is stronger than a CIS layer or the second electrode, a weak laser required for removing the CIS layer or the second electrode cannot process the first electrode. As a result, when the edge space is formed by using the strong laser, the CIS layer or the second electrode may be molten in the end part of the laminated film exposed to the edge space to be shunted in the division groove parts. Owing to the shunt, a problem arises that the conversion efficiency of the solar cell circuit is deteriorated.

Means for Solving the Problems

In order to solve the above-described problems, the solar cell module in the present invention has a preferable edge space that prevents characteristics of a solar cell such as conversion efficiency from being deteriorated without making processes complicated.

Namely, in a method for manufacturing a solar cell module including a substrate glass (409), a first layer (408) formed on the substrate glass (409) and a second layer (404, 405, 406) formed on the first layer (408), the method includes a step of forming a first edge space having a first width by removing the first layer (408) and the second layer (404, 405, 406) by the first width from an end part of the glass substrate (409) and a step of forming a second edge space by removing only the second layer by a second width from the end part of the glass substrate, and the width of the second edge space is larger than the width of the first edge space.

Further, according to a preferable aspect of the present invention, in a method for manufacturing a solar cell module having a substrate glass (409), a first layer (408) formed on the substrate glass (409) and a second layer (404, 405, 406) formed on the first layer (408), the method includes a step of forming a second edge space by removing only the second layer (404, 405, 406) by a third width and a step of forming a first edge space having a first width by removing at least the first layer (408) by the first width from an end part of the glass substrate (409), and the width of the second edge space is larger than the width of the first edge space.

Further, according to another aspect of the present invention, the second layer (404, 405, 406) is divided into a plurality of cells (302) by a plurality of division grooves (301) which divide the second layer (404, 405, 406), the second edge space is formed so as to be perpendicular to the division grooves (301), and the first layer (408) is harder than the second layer (404, 405, 406).

According to a still another aspect of the present invention, the third width is 0.1 mm or more and the step of forming the first edge space is carried out by removing both the first layer (408) and the second layer (404, 405, 406).

According to a still another aspect of the present invention, the third width is 10.1 mm or more from the end part of the glass substrate (409) and the step of forming the first edge space is carried out by removing only the first layer (408).

According to a still another aspect of the present invention, the width of the first edge space is 10 mm or more and the width of the second edge space is larger by 0.1 mm or more than the width of the first edge space.

According to a still another aspect of the present invention, the first layer (408) includes a first electrode including molybdenum and the second layer (404, 405, 406) includes a CIS layer (406) formed on the first layer (408), a buffer layer (405) formed on the CIS layer (406) and a second electrode layer (404) formed on the buffer layer (405).

According to a still another aspect of the present invention, the step of forming the second edge space is carried out by removing the second layer (404, 405, 406) by using a second laser or a mechanical scribe.

According to a still another aspect of the present invention, the step of forming the first edge space is carried out by removing the first layer (408) by using a first laser stronger than the second laser.

According to a still another aspect of the present invention, the step of forming the first edge space is carried out by removing the first layer (408) by using a sandblaster.

According to a further aspect of the present invention, the laser is a pulse laser.

MODE FOR CARRYING OUT THE INVENTION

Figure 4A:
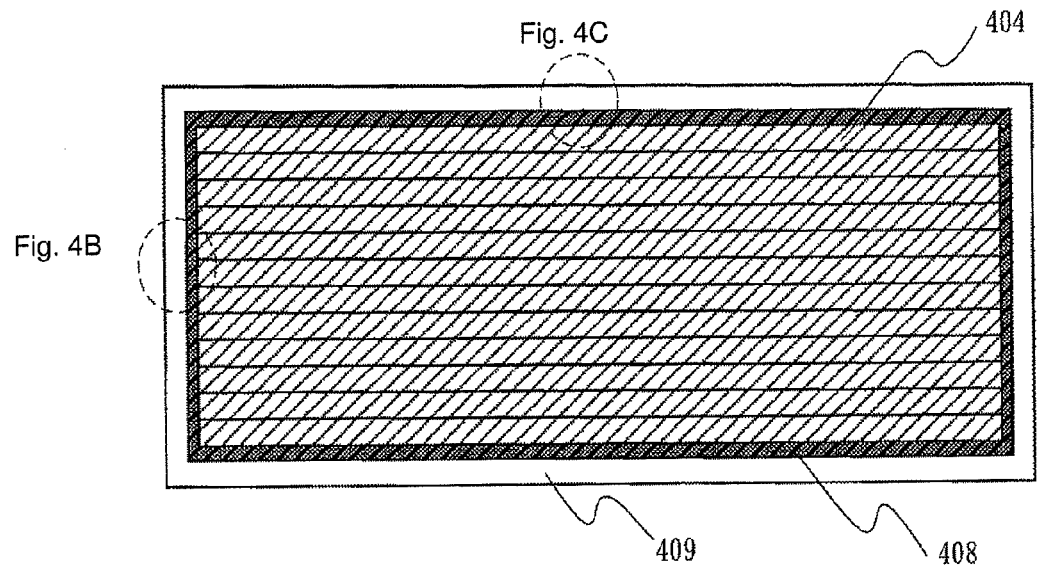
FIG. 4A shows a plan view of a solar cell module of a preferable embodiment of the present invention.
Figure 4B:
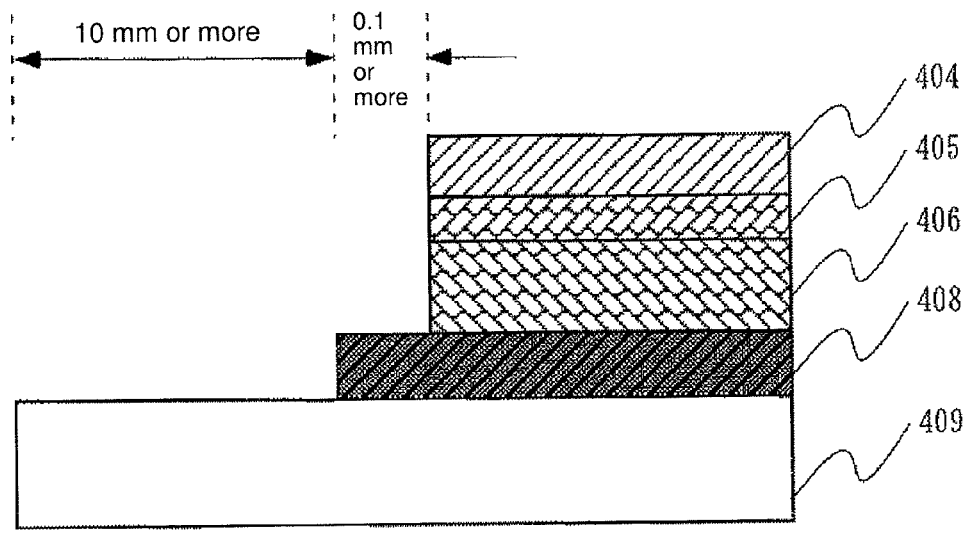
FIG. 4B shows an enlarged view (a part of a front view) of a section of an end part seen from a direction parallel to division grooves in FIG. 4A.
Figure 4C:
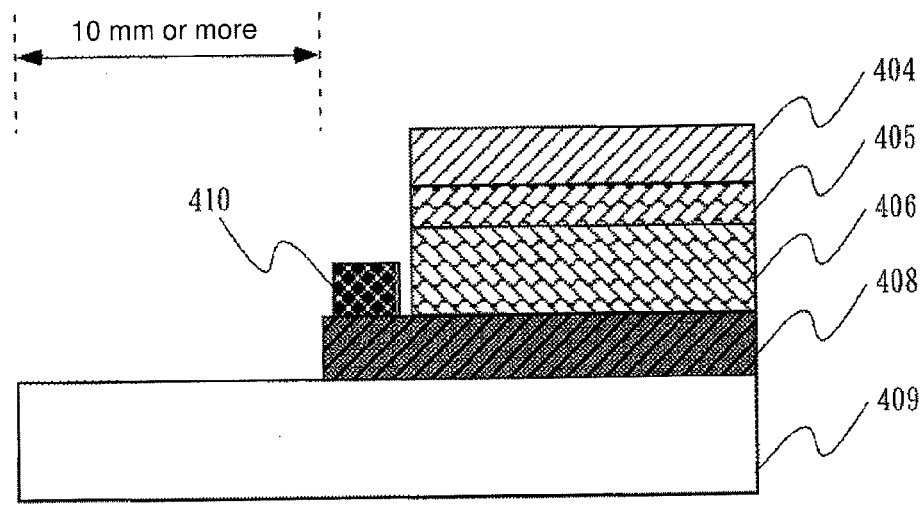
FIG. 4C is a sectional view having a part of a side view in FIG. 4A enlarged.

A solar cell circuit according to the present invention is shown in FIGS. 4A to 4C. FIG. 4A is a plan view seen from a light receiving surface side of a solar cell device. FIG. 4B is an enlarged view (a part of a front view) of a section of an end part seen from a direction parallel to division grooves. FIG. 4C is a sectional view having a part of a side view enlarged.
<Manufacturing Method of Solar Cell Circuit According to the Present Invention>

Figure 6A:
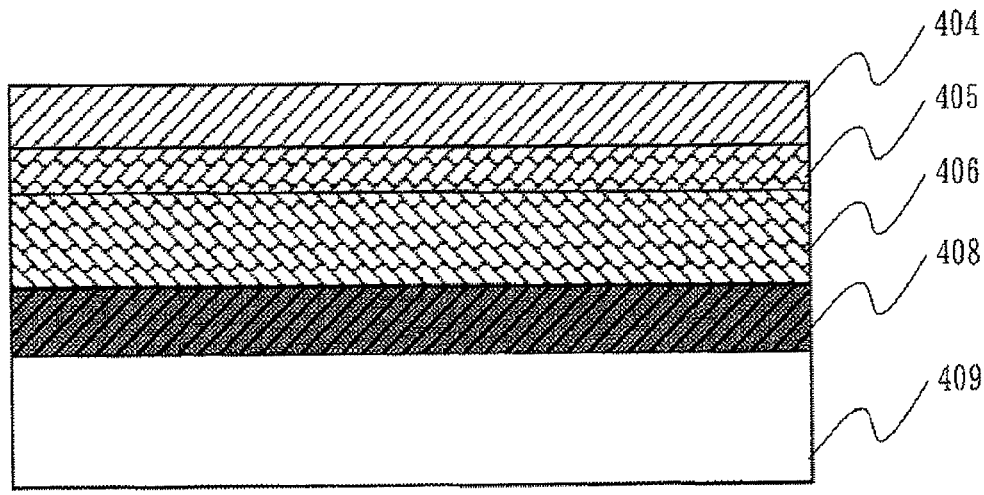
FIG. 6A shows a sectional view (a front view) of a solar cell circuit according to a preferable embodiment of the present invention before forming an edge space.
Figure 7A:
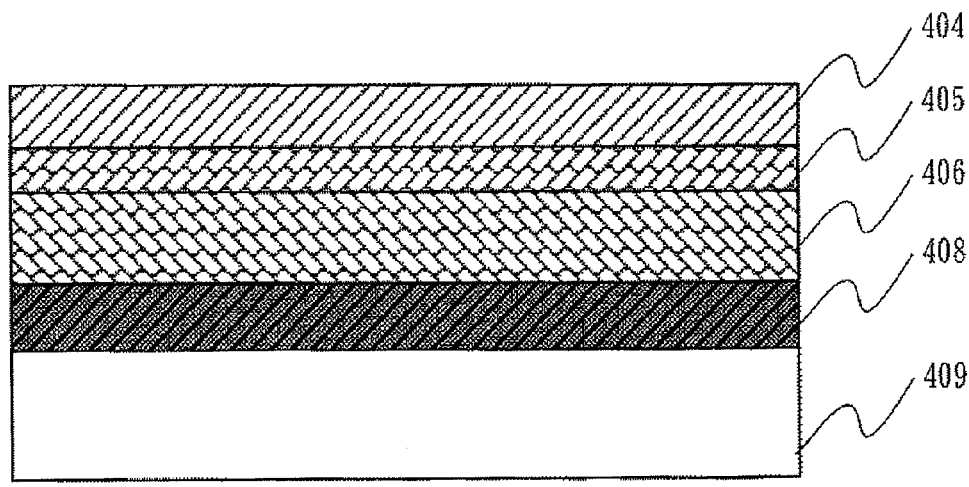
FIG. 7A shows a sectional view of a solar cell circuit according to a preferable embodiment of the present invention before forming an edge space.
Figure 7B:
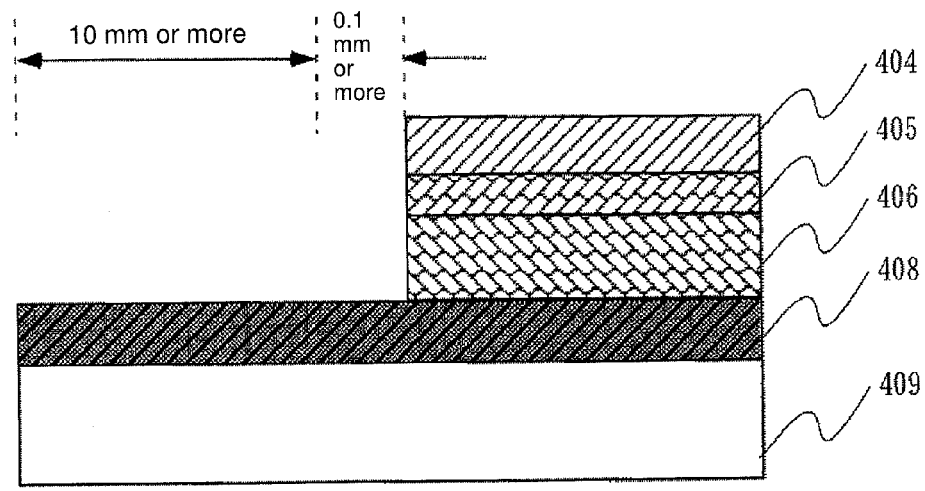
FIG. 7B shows a sectional view (a front view) of the solar cell circuit according to the preferable embodiment of the present invention in which a second edge space is formed.
Figure 7C:
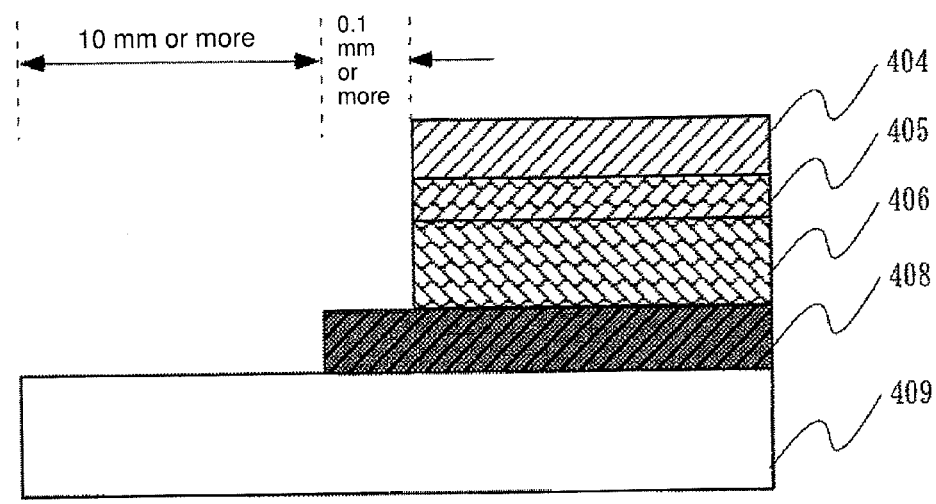
FIG. 7C is a sectional view (a front view) of the solar cell module according to the preferable embodiment of the present invention to which an edge space process is applied.
Figure 8A:
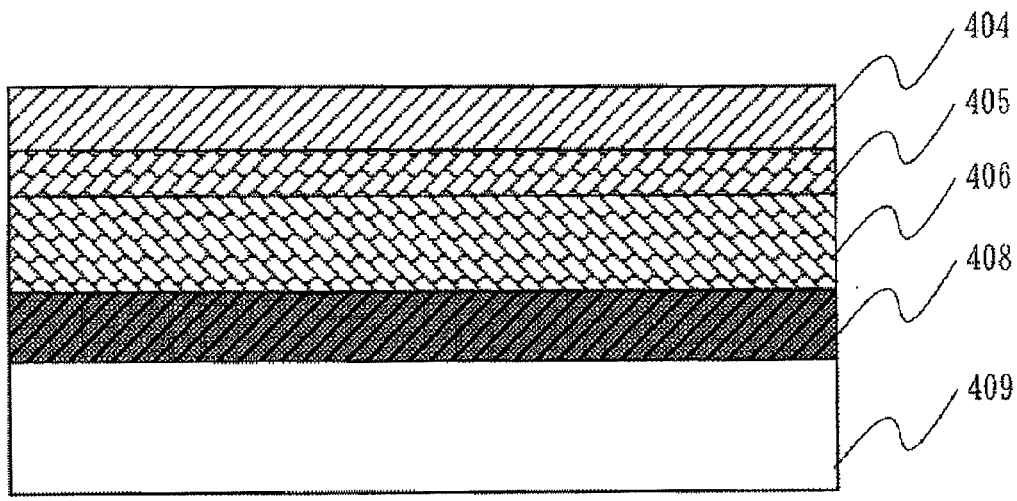
FIG. 8A shows a sectional view of a solar cell circuit according to a preferable embodiment of the present invention before forming an edge space.

Now, a manufacturing method of a solar cell circuit according to a preferable embodiment of the present invention will be described below. FIG. 6A, FIG. 7A and FIG. 8A respectively show sectional views of solar cell circuits before forming an edge space. In the preferable embodiment, a first electrode (an Mo layer) (408) is formed on a glass substrate (409). A CIS layer (406), a buffer layer (405) and a second electrode (TCO) (404) are sequentially formed thereon. In other embodiments, a thin film solar cell including an amorphous silicon-based solar cell except the CIS-based solar cell may have the same constitution.

(1) First Preferable Embodiment

Figure 6B:
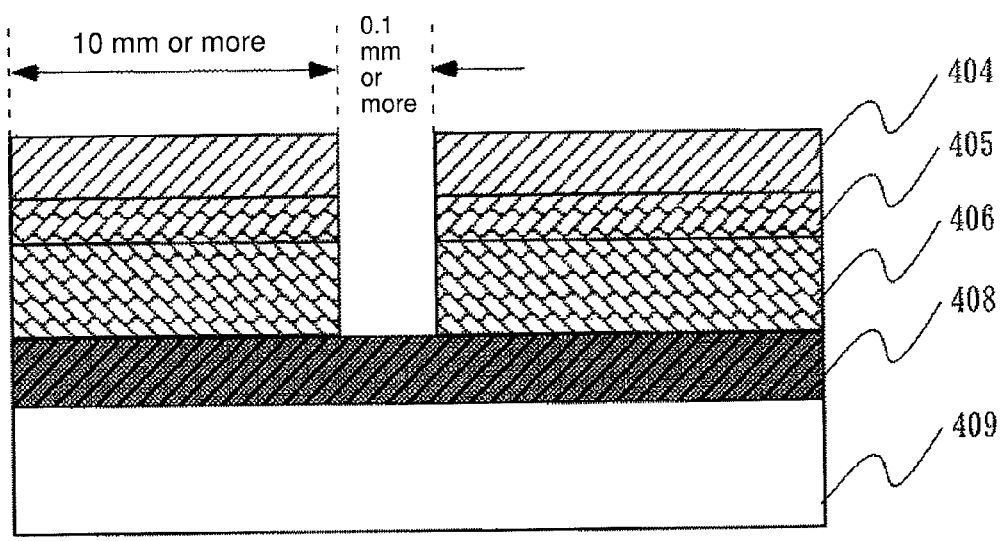
FIG. 6B shows a sectional view (a front view) of the solar cell circuit according to the preferable embodiment of the present invention in which a second layer is removed.

Initially, a laser having weak energy is applied from the glass substrate side of such a solar cell circuit, thereby removing other layers than the first electrode (refer it also to as a "first layer" hereinafter) (408), that is, the CIS layer (406), the buffer layer (405) and the second electrode (404) (refer them also to as "second layers" or a "group of second layers", hereinafter). A place to be removed by the irradiation of the laser is located inside by 10 mm or more from ends of the layers including the glass substrate (409) respectively and a removed width is preferably 0.1 to 1 mm or more (see FIG. 6B). As for the irradiation of the laser, a pulse laser is preferably used. When the layers respectively have the thickness of about 2 to 3 µm, other layers than the first electrode, that is, the second layers (404, 405, 406) can be removed by a pulse frequency of about 6 kHz and energy equivalent to 9 W. In another preferable embodiment, the laser is not applied from the glass substrate side and may be applied from the second electrode side. In a still another embodiment, the second layers (404, 405, 406) may be removed by a mechanical scribing including a knife in place of the weak laser.

The stronger first electrode (the Mo layer) (408) cannot be removed by applying the above-described laser having the weak energy. In order to remove the first electrode (408), a strong laser having the pulse frequency of about 6 kHz and equivalent to 430 W needs to be applied. When the laser of such a strong energy is applied to all the layers together, ends of the second layers (404, 405, 406) which are not stronger than the first electrode (408) may be damaged by the irradiation of the strong energy to deteriorate the conversion efficiency of the circuit.

Figure 6C:
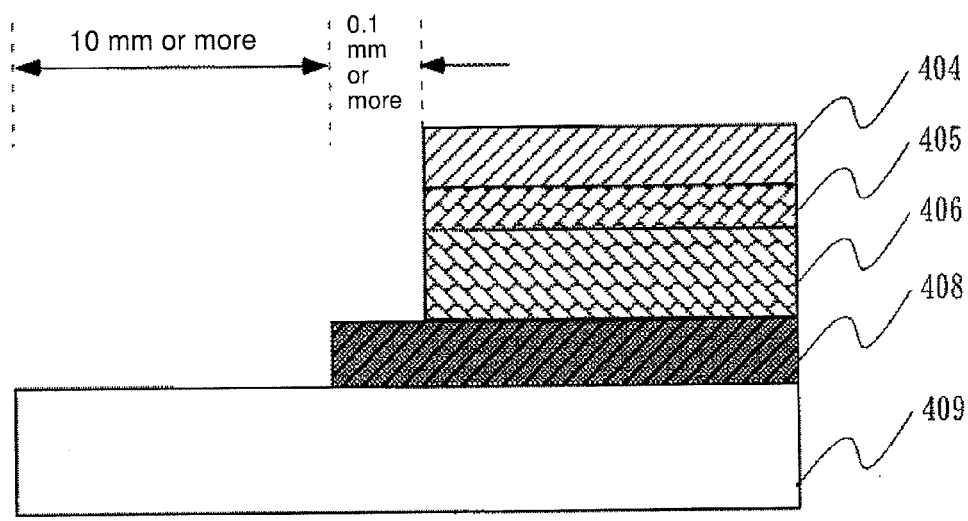
FIG. 6C is a sectional view (a front view) of the solar cell module according to the preferable embodiment of the present invention to which an edge space process is applied.

Accordingly, as shown in FIG. 6C, the strong laser is applied to remove the first electrode in such a way that the first electrode (408) is left by 0.1 to 1 mm or more than the second layers (404, 405, 406) so as not to give an influence to the ends of the second layers (404, 405, 406). Since the strong laser is applied to such a position, the ends of the second layers (404, 405, 406) are not damaged due to the irradiation of the strong energy and the conversion efficiency of the circuit can be prevented from being deteriorated. Such a strong laser is preferably applied from the glass substrate side, however, the strong laser may be applied from the second electrode side. Consequently, a first edge space in which the first electrode (408) is not formed is provided with a width of 10 mm or more. Further, a second edge space in which the second layers (404, 405, 406) are not formed is provided with a width larger by 0.1 to 1 mm or more than the first edge space.

In other preferable embodiments, a sandblaster may be used in place of the strong pulse laser. When the sandblaster is used, the end parts of the second layers (404, 405, 406) exposed to the second edge space are preferably masked before a sandblaster process.

(2) Second Preferable Embodiment

A laser having weak energy is applied from a glass substrate (409) side of a solar cell circuit shown in FIG. 7A, thereby removing other layers than a first electrode (408), that is, a CIS layer (406), a buffer layer (405) and a second electrode (404) by 10 mm or more from ends. Thus, an edge space (a second edge space) is formed. As for an irradiation of the laser, a pulse laser is preferably used similarly to the above-described first preferable embodiment. When the layers respectively have the thickness of about 2 to 3 µm, the second edge space can be formed by a pulse frequency of about 6 kHz and energy equivalent to 9 W. In another embodiment, the second edge space may be formed by a mechanical scribing including a knife in place of the weak laser.

As described above, the stronger first electrode (an Mo layer) (408) cannot be removed by applying the above-described laser having the weak energy. A strong laser having the pulse frequency of about 6 kHz and equivalent to 430 W is applied to subsequently remove the first electrode (408) and form a first edge space. In other preferable embodiment, a sandblaster may be used in place of the strong pulse laser. When the sandblaster is used, the end parts of the second layers (404, 405, 406) exposed to the second edge space are preferably masked before a sandblaster process.

In any cases, the first edge space is formed so that the first edge space has a width of 10 mm or more from the end of the glass substrate (409) and the width thereof is smaller by 0.1 to 1 mm or more than that of the second edge space. In other words, the second edge space is formed so that the second edge space has a width larger by 0.1 to 1 mm or more than that of the first edge space and the width of the second edge space is 10 mm or more.

(3) Third Preferable Embodiment

A laser having strong energy is applied from a glass substrate (409) side of a solar cell circuit shown in FIG. 8A, thereby removing all laminated layers (a first electrode, a CIS layer, a buffer layer and a second electrode) by 10 mm or more from ends. Thus, a first edge space is formed (see FIG. 8B). As for an irradiation of the laser, a pulse laser is preferably used similarly to the above-described preferable embodiment. When the layers respectively have the thickness of about 2 to 3 µm, all the layers can be removed by a pulse frequency of about 6 kHz and energy equivalent to 430 W. In other preferable embodiment, a sandblaster may be used in place of the strong pulse laser. When the laser having the strong energy is applied to all the layers or the sandblaster is applied to all the layers, especially, ends of second layers (404, 405, 406) are damaged.

Figure 8B:
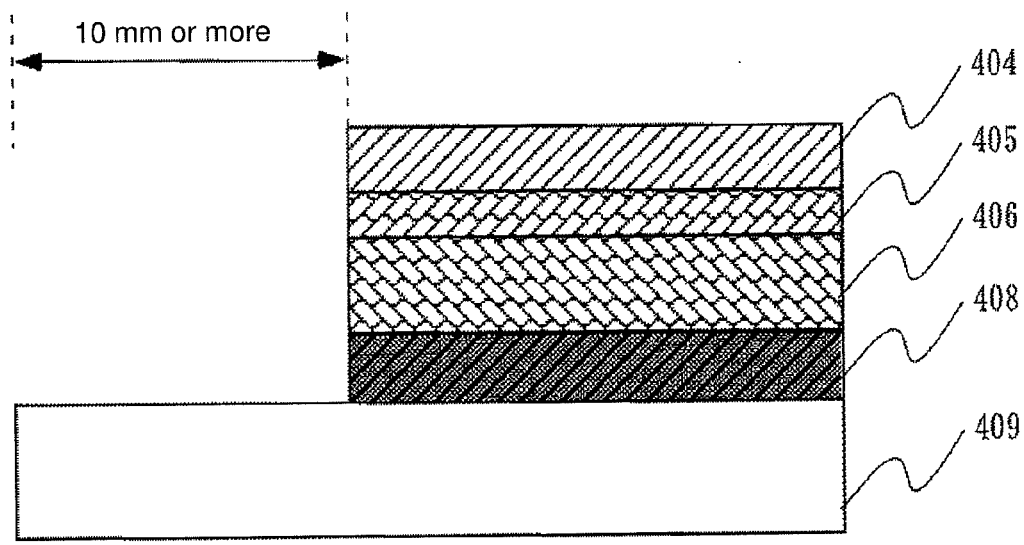
FIG. 8B shows a sectional view (a front view) of the solar cell circuit according to the preferable embodiment of the present invention in which a first edge space is formed.
Figure 8C:
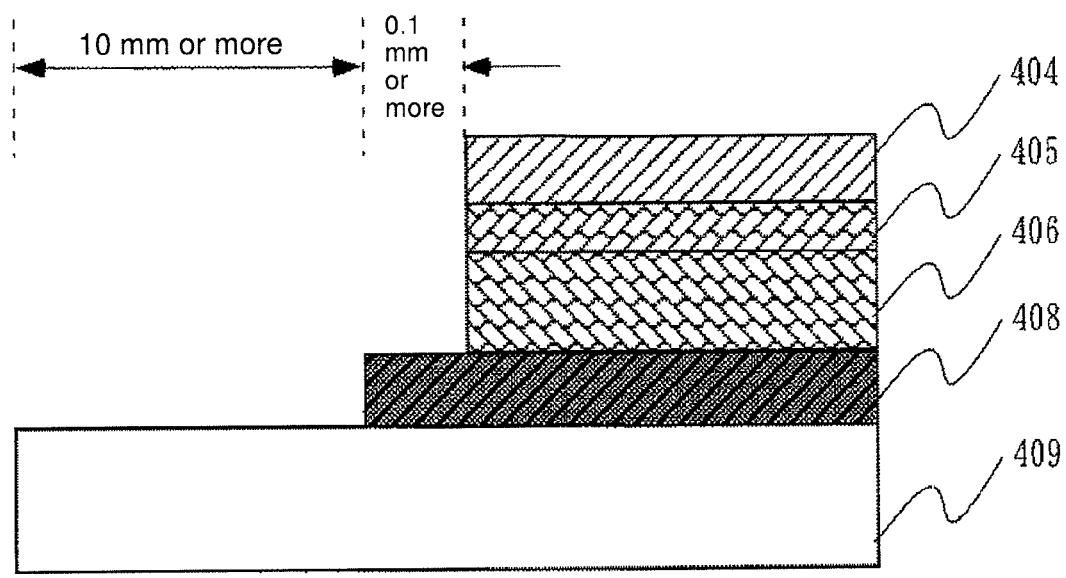
FIG. 8C is a sectional view (a front view) of the solar cell module according to the preferable embodiment of the present invention to which an edge space process is applied.

Then, as shown in FIG. 8C, a laser having weak energy is applied so that a second edge space is formed inside by 0.1 to 1 mm or more from the first edge space formed as described above. As for the irradiation of the weak laser, the pulse laser is preferably used similarly to the above-described preferable embodiment. When the layers respectively have the thickness of about 2 to 3 µm, other layers than the first electrode (408), that is, the second layers (404, 405, 406) can be removed by a pulse frequency of about 6 kHz and energy equivalent to 9 W. In another preferable embodiment, the laser is not applied from the glass substrate side and may be applied from the second electrode side. In a still another embodiment, the second layers (404, 405, 406) may be removed by a mechanical scribing including a knife in place of the weak laser.

In any case, the first edge space is formed so that the first edge space has a width of 10 mm or more from the end of the glass substrate and the width is smaller by 0.1 to 1 mm or more than that of the second edge space. In other words, the second edge space is formed so that the second edge space has a width larger by 0.1 to 1 mm or more than that of the first edge space and the width of the second edge space is 10 mm or more.

<Evaluation>

Now, influences that the solar cell circuits according to the present invention which are formed by the above-described preferable embodiments give to conversion efficiency by carrying out the above-described processes will be evaluated as described below.

Figure 5A:
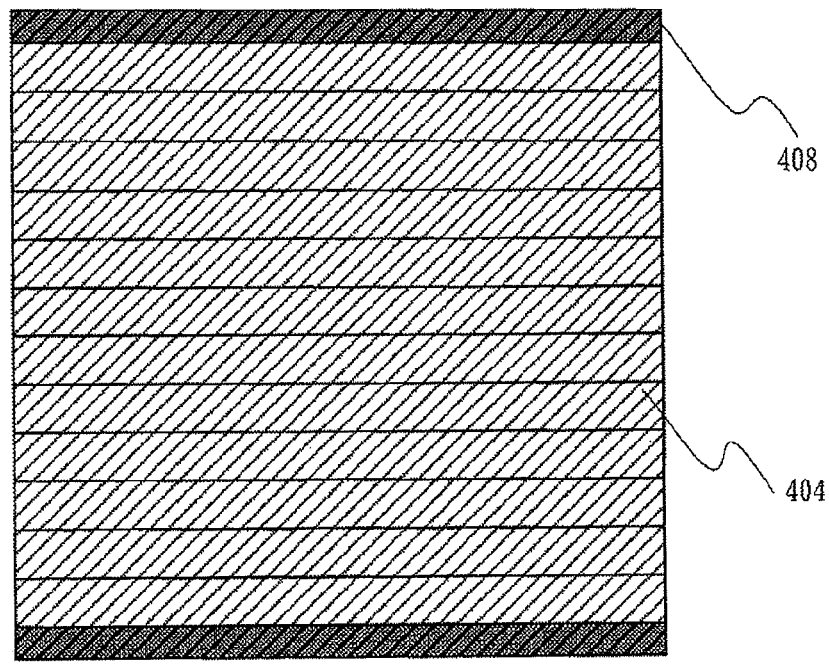
FIG. 5A is one example of a sample device (before processing) that evaluates effects of the invention.
Figure 5B:
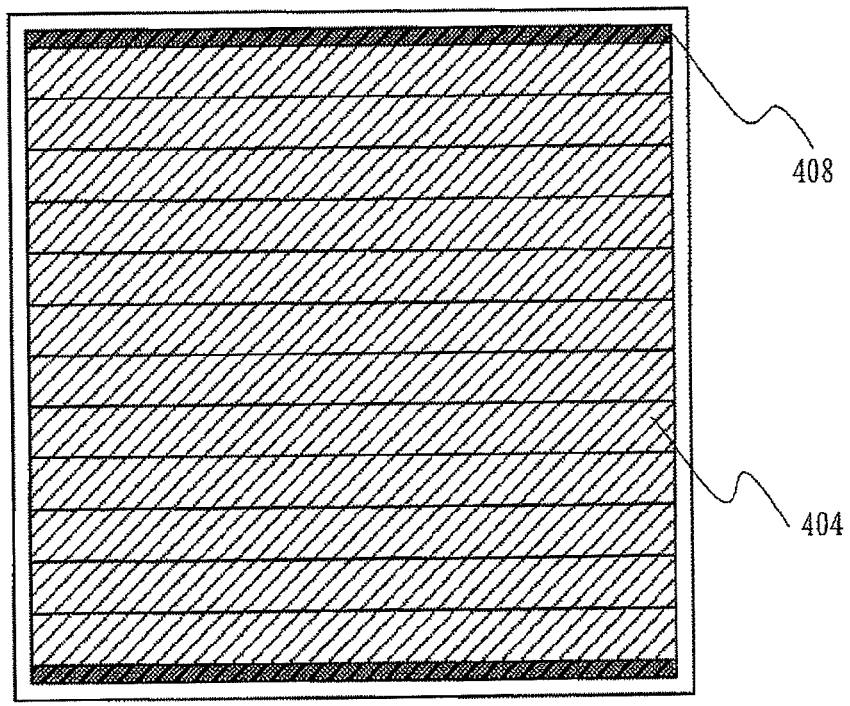
FIG. 5B is one example of the sample device (after processing) that evaluates the effects of the invention.

FIG. 5A shows one example of a plan view of a solar cell before an edge space process. FIG. 5B shows one example of a plan view of the solar cell after the edge space process. In any of cases, the solar cell having a dimension of 30 cm×30 cm is used.

Figure 1A:
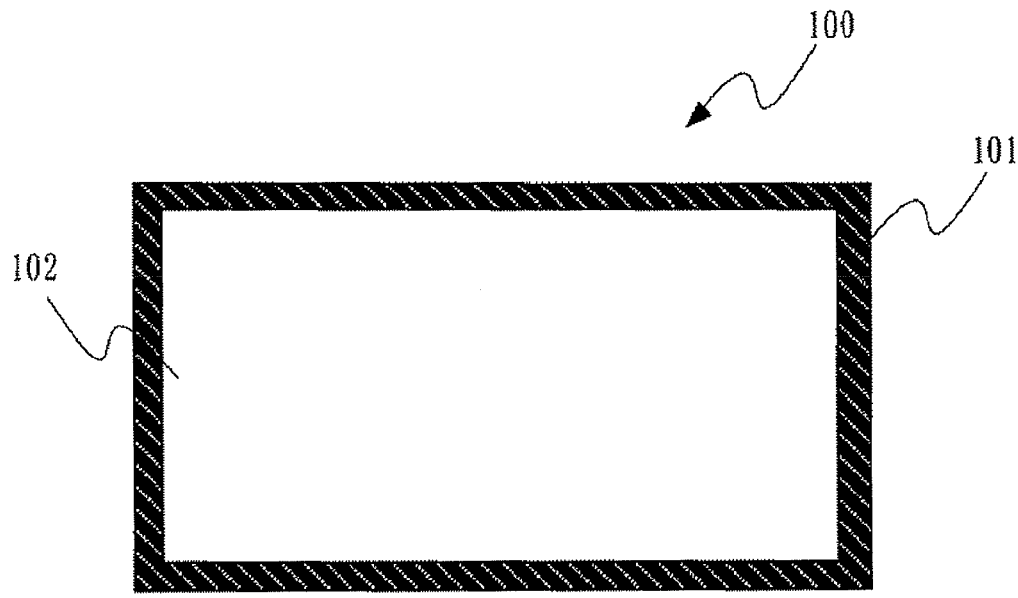
FIG. 1A shows a plan view of a frame type solar cell module according to a conventional technique.
Figure 1B:
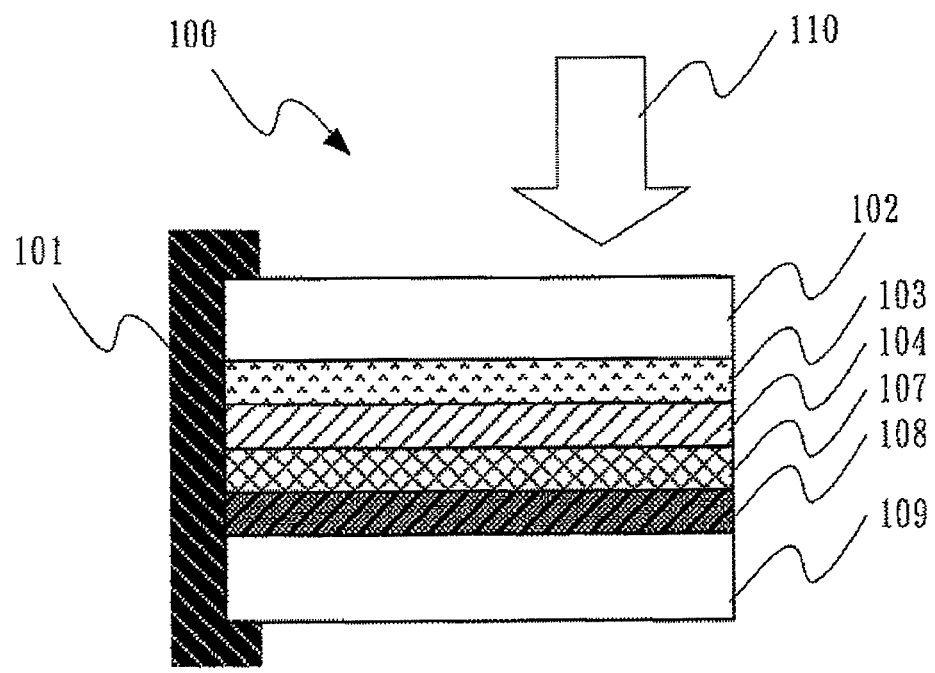
FIG. 1B shows an enlarged view (a front view) of a section of an end part of the frame type solar cell module according to the conventional technique.
Figure 2:
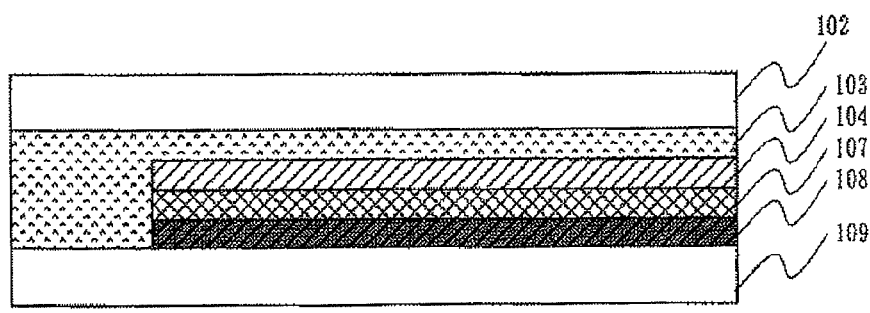
FIG. 2 shows an enlarged view (a front view) of a section of an end part of a frameless type solar cell module according to a conventional technique.
Figure 3A:
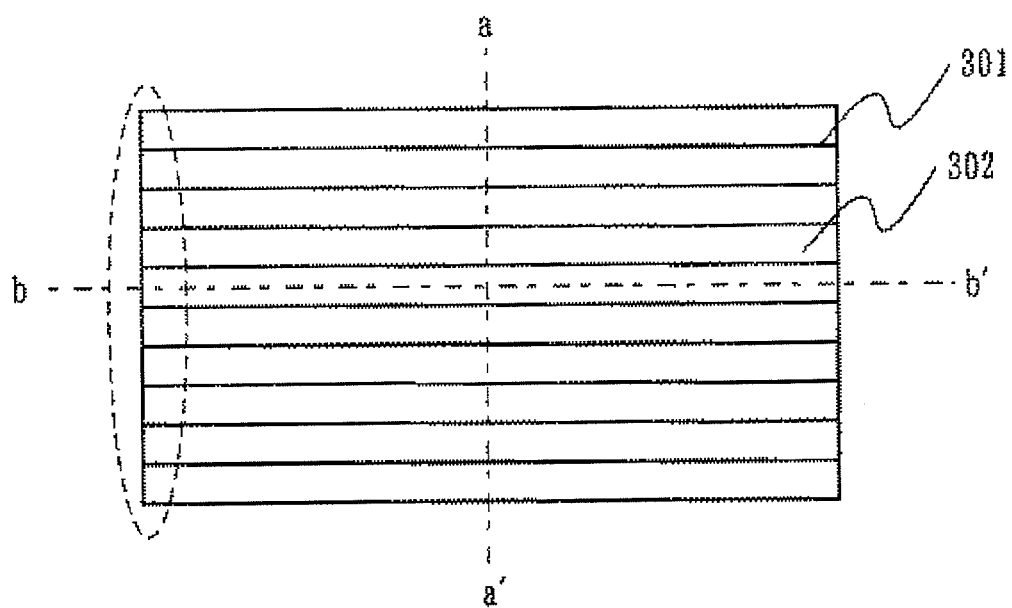
FIG. 3A shows a plan view of the frameless type solar cell module according to the conventional technique.
Figure 3B:
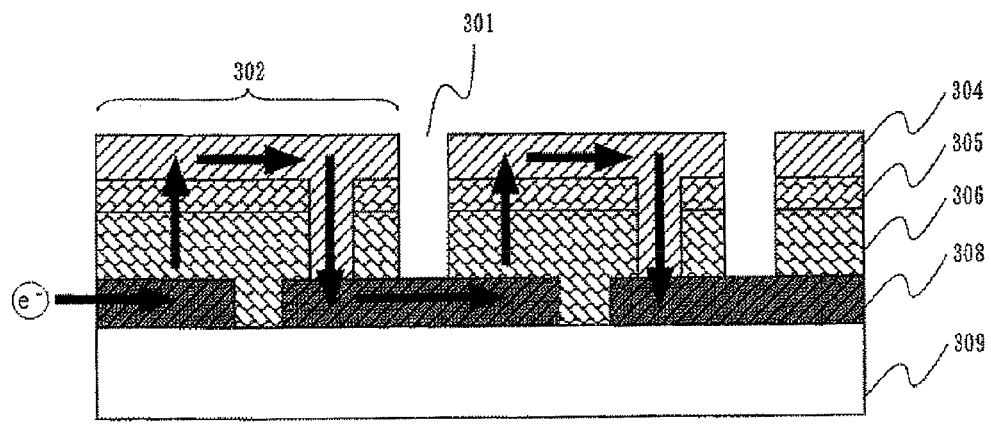
FIG. 3B shows an enlarged view (a front view) of a section of an end part of the frameless type solar cell module according to the conventional technique.

As shown in FIG. 2 as a conventional technique, the solar cell that has the same width of the first edge space as the width of the second edge space, namely, a sample device 6 and a sample device 7 that have been processed to a state shown in FIG. 8B were prepared, and results are shown in Table 1 which were obtained by measuring $E_{FF}$ (conversion efficiency) and FF (Fill Factor) before and after the process shown in FIG. 8B is carried out.

TABLE 1

| Evaluation item | | Device 6 | Device 7 |
|---|---|---|---|
| $E_{FF}$ | Before process | 12.945 | 13.749 |
| | After process | 12.248 | 12.021 |
| | Ratio of change | 0.946 | 0.874 |
| FF | Before process | 0.615 | 0.658 |
| | After process | 0.592 | 0.594 |
| | Ratio of change | 0.963 | 0.903 |

As compared therewith, as samples obtained by carrying out the processes in the present invention, namely, the samples formed in such a way that the second edge space is formed so as to have a width larger by 0.1 to 1 mm or more than that of the first edge space and the width of the edge space is 10 mm or more, devices 1 to 4 were prepared. Results are shown in Table 2 which were obtained by measuring $E_{FF}$ (conversion efficiency) and FF (Fill Factor) before and after the processes according to the present invention are carried out.

TABLE 2

| Evaluation item | | Device 1 | Device 2 | Device 3 | Device 4 |
|---|---|---|---|---|---|
| $E_{FF}$ | Before process | 12.581 | 12.506 | 12.865 | 13.273 |
| | After process | 12.736 | 12.485 | 12.813 | 13.291 |
| | Ratio of change | 1.012 | 0.998 | 0.996 | 1.001 |
| FF | Before process | 0.618 | 0.613 | 0.625 | 0.641 |
| | After process | 0.619 | 0.611 | 0.622 | 0.639 |
| | Ratio of change | 1.002 | 0.997 | 0.995 | 0.997 |

In any of the samples, the laser was applied from the glass substrate side. In the sample devices 6 and 7, a process of applying the pulse laser having 6 kHz and 430 W was carried out to remove all the layers. In the sample devices 1 to 4, the pulse laser having 6 kHz and 430 W is used to form the first edge space and the pulse laser having 6 kHz and 9 W is used to form the second edge space.

It can be recognized that the ratios of change of the device 1 to the device 4 are more greatly improved than those of the conventional process in any of the items $E_{FF}$ and FF. In the conventional process, the ends of the second layers (404, 405, 406) are supposed to be damaged by the irradiation of the strong laser. However, since the second edge space is provided by applying the weak laser in the present invention, the damaged ends of the second layers (404, 405, 406) are removed, which is supposed to be a great factor for reducing a trouble such as a shunt in the division grooves.

DESCRIPTION OF THE REFERENCE NUMERALS AND SIGNS

100 solar cell module
101 frame
102 cover glass
103 filler
104 second electrode (TCO)
107 semiconductor layer (buffer layer+CIS layer)
108 first electrode (Mo layer)
109 substrate
110 solar light
301 division groove
302 cell
304 second electrode (TCO)
305 buffer layer
306 CIS layer
308 first electrode (Mo layer)
309 glass substrate
404 second electrode (TCO)
405 buffer layer
406 CIS layer
408 first electrode (Mo layer)
409 glass substrate
410 ribbon wire

What is claimed is:

1. A method for manufacturing a solar cell module comprising a glass substrate, a first layer formed on the glass substrate and a second layer formed on the first layer, the method comprising:
   a step of forming a second edge space having a second width by removing only the second layer by the second width from an end part of the glass substrate; and
   a step of forming a first edge space having a first width by removing the first layer by the first width from an end part of the glass substrate,
   wherein
      the first layer is harder than the second layer,
      the width of the second edge space is larger than the width of the first edge space,
      the second layer is divided into a plurality of cells by a plurality of division grooves that divide the second layer,
      the first edge space is formed on a peripheral edge of the glass substrate such that a length-wise direction of the first edge space runs parallel to the entire peripheral edge of the glass substrate so as to be perpendicular to the division grooves,
      the second edge space is formed on the peripheral edge of the glass substrate such that a length-wise direction of the second edge space runs parallel to the entire peripheral edge of the glass substrate,
      the second edge space is perpendicular to the division grooves and intersects the division grooves,
      the step of forming the first edge space is carried out after the step of forming the second edge space, the plurality of division grooves that divide the second layer are formed prior to the steps of forming the first and second edge spaces, and a top surface and a side surface of the glass substrate form the peripheral edge of the glass substrate.

2. A method for manufacturing a solar cell module according to claim 1, wherein the width of the first edge space is 10 mm or more, and the width of the second edge space is larger by 0.1 mm or more than the width of the first edge space.

3. A method for manufacturing a solar cell module according to claim 1, wherein the first layer comprises a first electrode including molybdenum.

4. A method for manufacturing a solar cell module according to claim 1, wherein the second layer comprises:

a CIS layer formed on the first layer;

a buffer layer formed on the CIS layer; and a second electrode layer formed on the buffer layer.

5. A method for manufacturing a solar cell module according to claim 1, wherein the step of forming the second edge space is carried out by removing the second layer by using a second laser.

6. A method for manufacturing a solar cell module according to claim 1, wherein the step of forming the second edge space is carried out by removing the second layer by using a mechanical scribe.

7. A method for manufacturing a solar cell module according to claim 1, wherein the step of forming the first edge space is carried out by removing the first layer by using a first laser.

8. A method for manufacturing a solar cell module according to claim 1, wherein the step of forming the first edge space is carried out by removing the first layer by using a sandblaster.

\* \* \* \* \*